US011656262B2

(12) United States Patent
Zhu (10) Patent No.: US 11,656,262 B2
(45) Date of Patent: May 23, 2023

(54) SOFTWARE SIMULATION SYSTEM FOR INDOOR EMC TEST

(71) Applicant: Baidu USA LLC, Sunnyvale, CA (US)

(72) Inventor: Fan Zhu, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 528 days.

(21) Appl. No.: 16/849,304

(22) Filed: Apr. 15, 2020

(65) Prior Publication Data

US 2021/0325439 A1 Oct. 21, 2021

(51) Int. Cl.
*G01R 31/28* (2006.01)
*G01R 31/00* (2006.01)
*H04L 12/40* (2006.01)

(52) U.S. Cl.
CPC ...... *G01R 31/001* (2013.01); *H04L 12/40013* (2013.01); *B60W 2756/10* (2020.02); *H04L 2012/40215* (2013.01)

(58) Field of Classification Search
CPC .. G01R 31/001; G01R 31/006; G01R 31/007; G01R 29/0821; G01R 29/105; H04L 12/40013; H04L 2012/40215; B60W 2756/10
See application file for complete search history.

(56) References Cited

U.S. PATENT DOCUMENTS

| | | | | |
|---|---|---|---|---|
| 5,533,388 A | * | 7/1996 | Yamamoto | G01R 29/0821 73/116.01 |
| 10,663,505 B2 | * | 5/2020 | Jones | G11B 27/34 |
| 2018/0375594 A1 | * | 12/2018 | Kildal | H04B 17/102 |
| 2021/0018547 A1 | * | 1/2021 | Brigance | G01R 29/0821 |
| 2021/0080496 A1 | * | 3/2021 | Liu | G01R 29/0821 |

* cited by examiner

*Primary Examiner* — Thang X Le
(74) *Attorney, Agent, or Firm* — Womble Bond Dickinson (US) LLP (57) ABSTRACT

According to some embodiments, a method of performing EMC testing of an ADV can be used According to some embodiments, a method of performing EMC testing of an ADV can be used to test how software and hardware components in the ADV are impacted in an indoor EMC testing environment. According to the method, the ADV can be positioned at a fixed spot in the indoor EMC testing environment, and can be driven in an autonomous driving mode for a predetermined period of time. One or more of the autonomous driving modules of the ADV are modified to accommodate the positioning of the ADV at the fixed spot and the indoor EMC testing environment. The ADV can determine if each of a plurality of performance parameters meets its performance metric during the predetermined period of time. If each performance parameters meets its performance metric, the ADV is considered to have passed the EMC testing.

20 Claims, 8 Drawing Sheets

SOFTWARE SIMULATION SYSTEM FOR INDOOR EMC TEST

TECHNICAL FIELD

Embodiments of the present disclosure relate generally to autonomous driving vehicles. More particularly, embodiments of the disclosure relate to performing electromagnetic computability (EMC) testing of autonomous driving vehicles in an indoor environment.

BACKGROUND

Vehicles operating in an autonomous mode (e.g., driverless) can relieve occupants, especially the driver, from some driving-related responsibilities. When operating in an autonomous mode, the vehicle can navigate to various locations using onboard sensors, allowing the vehicle to travel with minimal human interaction or in some cases without any passengers.

An autonomous driving vehicle (ADV) relies on its autonomous driving system to drive the vehicle. The autonomous driving system can include software and hardware, whose performance may be impacted by strong electromagnetic inference. To comply with government regulations or to ensure the safety of the autonomous driving vehicle, the vehicle needs to go through an EMC testing, to test how the software and hardware in the vehicle are impacted under an EMC testing environment.

It is generally difficult to find an appropriate outdoor environment to perform EMC testing of an autonomous driving vehicle, because the electromagnetic inference outside typically is not strong enough to have a meaningful impact on the software and hardware of the vehicle. Therefore, for EMC testing purposes, an indoor EMC testing environment is frequently used, where the electromagnetic inference of a desired level can be artificially created.

However, there may be some limitations associated with the indoor EMC testing environment. For example, an autonomous driving vehicle cannot freely move as it does in an outdoor environment. As a result, the autonomous driving system of the vehicle may need to be modified to accommodate the limitations such that the EMC testing of the vehicle would be conducted as if the vehicle normally had traveled in an outdoor environment.

BRIEF DESCRIPTION OF THE DRAWINGS

Embodiments of the disclosure are illustrated by way of example and not limitation in the figures of the accompanying drawings in which like references indicate similar elements.

DETAILED DESCRIPTION

Various embodiments and aspects of the disclosures will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosures.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

According to some embodiments, a method of performing EMC testing of an ADV can be used to test how software and hardware components in the ADV are impacted in an indoor EMC testing environment that represents or mimics a particular driving scenario or driving scene. According to the method, the ADV can be positioned at a fixed spot within the indoor EMC testing environment, and can be driven in an autonomous driving mode for a predetermined period of time. One or more of the autonomous driving modules of the ADV are modified to accommodate the positioning of the ADV at the fixed spot and the indoor EMC testing environment, while simulating driving operations as of the ADV were driving in a real-time environment, such as, for example, simulate localization without using the real GPS/IMU sensors or map data. The ADV can determine if each of a plurality of performance parameters meets its performance metric during the predetermined period of time. If each performance parameters meets its performance metric, the ADV is considered to have passed the EMC testing.

In one embodiment, the performance parameters for each autonomous driving module and its respective performance metric can be predefined by the EMC testers. Alternatively, there may be a set of performance parameters and associated performance metrics for the autonomous driving modules as a whole. One example of such a performance parameter is the end-to-end latency of the autonomous driving modules, and one example of such a performance metric is the end-to-end latency.

In one embodiment, an EMC simulator can be installed in the ADV. The EMC simulator includes a duplicate of each autonomous driving module of the ADV, with one or more such duplicates being modified to accommodate the indoor EMC testing environment and the limitations it places on the ADV. Without such modifications, some of the duplicate autonomous driving modules would malfunction or function in an undesired manner.

Examples of the limitations include the positioning the ADV at a fixed location, allowing the car wheels of the ADV to move forward and backward but preventing them from making turns, lack of one or more types of sensor data, and lack of map information for the indoor EMC testing environment.

In one embodiment, the autonomous driving modules that are modified include a localization module, a perception module, a planning function, a prediction module, a redundant module, and a controller area network (CANbus) module. The localization module is modified such that it can determine a position of the ADV in a number of driving cycles based on a given initial position, a given initial heading, and a plurality of driving commands. The localization of the vehicle is derived from the initial position using a simulation algorithm without relying on the GPS/IMU sensors on the actual location of the vehicle.

In one embodiment, the perception module is modified such that one or more of the following changes are to occur: that the perception module is to be tested only with objects within a predetermined distance, that calculation of a relative speed between the ADV and an object within the predetermined distance is compensated for the fixed position of the ADV, and that the perception module is to be tested only with objects on either side of the ADV.

In one embodiment, the planning module is modified such that feedback to the planning module is disabled. The redundant module is modified such that the module would not monitor one or more items to avoid unnecessary alarms or warning messages. The prediction module is modified such that only free moves are used to predict a next move of a moving object. The CAN bus module is modified such that only longitudinal wheel controls are allowed.

Autonomous Driving Vehicle

Figure 1:
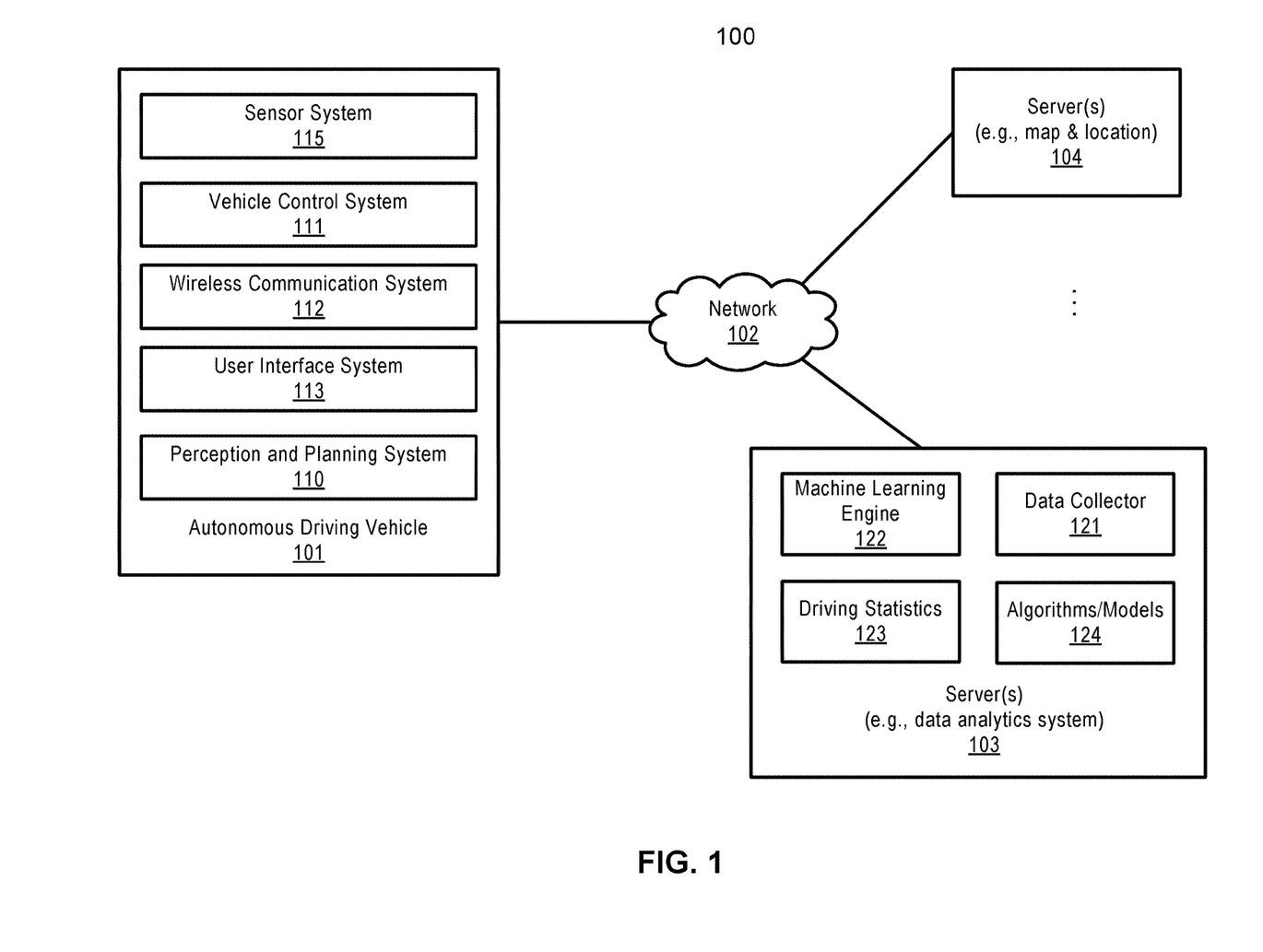
FIG. 1 is a block diagram illustrating a networked system according to one embodiment.

FIG. 1 is a block diagram illustrating an autonomous vehicle network configuration according to one embodiment of the disclosure. Referring to FIG. 1, network configuration 100 includes autonomous vehicle 101 that may be communicatively coupled to one or more servers 103-104 over a network 102. Although there is one autonomous vehicle shown, multiple autonomous vehicles can be coupled to each other and/or coupled to servers 103-104 over network 102. Network 102 may be any type of networks such as a local area network (LAN), a wide area network (WAN) such as the Internet, a cellular network, a satellite network, or a combination thereof, wired or wireless. Server(s) 103-104 may be any kind of servers or a cluster of servers, such as Web or cloud servers, application servers, backend servers, or a combination thereof. Servers 103-104 may be data analytics servers, content servers, traffic information servers, map and point of interest (MPOI) servers, or location servers, etc.

An autonomous vehicle refers to a vehicle that can be configured to in an autonomous mode in which the vehicle navigates through an environment with little or no input from a driver. Such an autonomous vehicle can include a sensor system having one or more sensors that are configured to detect information about the environment in which the vehicle operates. The vehicle and its associated controller(s) use the detected information to navigate through the environment. Autonomous vehicle 101 can operate in a manual mode, a full autonomous mode, or a partial autonomous mode.

In one embodiment, autonomous vehicle 101 includes, but is not limited to, perception and planning system 110, vehicle control system 111, wireless communication system 112, user interface system 113, and sensor system 115. Autonomous vehicle 101 may further include certain common components included in ordinary vehicles, such as, an engine, wheels, steering wheel, transmission, etc., which may be controlled by vehicle control system 111 and/or perception and planning system 110 using a variety of communication signals and/or commands, such as, for example, acceleration signals or commands, deceleration signals or commands, steering signals or commands, braking signals or commands, etc.

Components 110-115 may be communicatively coupled to each other via an interconnect, a bus, a network, or a combination thereof. For example, components 110-115 may be communicatively coupled to each other via a controller area network (CAN) bus. A CAN bus is a vehicle bus standard designed to allow microcontrollers and devices to communicate with each other in applications without a host computer. It is a message-based protocol, designed originally for multiplex electrical wiring within automobiles, but is also used in many other contexts.

Figure 2:
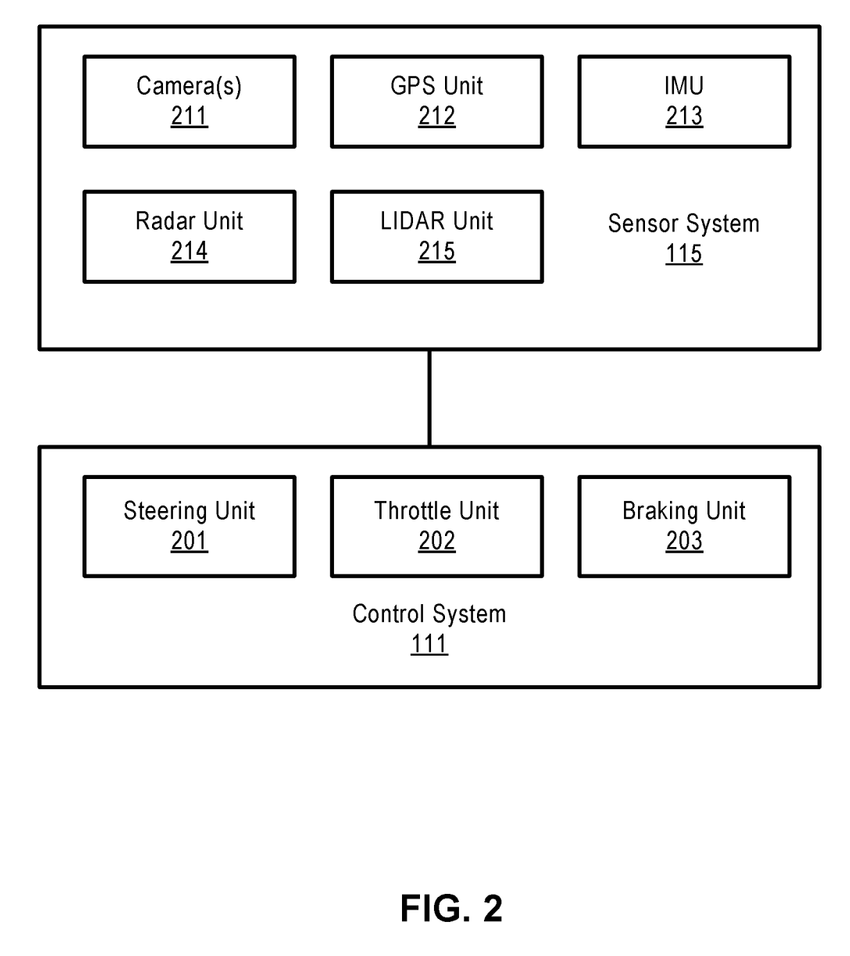
FIG. 2 is a block diagram illustrating an example of an autonomous vehicle according to one embodiment.

Referring now to FIG. 2, in one embodiment, sensor system 115 includes, but it is not limited to, one or more cameras 211, global positioning system (GPS) unit 212, inertial measurement unit (IMU) 213, radar unit 214, and a light detection and range (LIDAR) unit 215. GPS system 212 may include a transceiver operable to provide information regarding the position of the autonomous vehicle. IMU unit 213 may sense position and orientation changes of the autonomous vehicle based on inertial acceleration. Radar unit 214 may represent a system that utilizes radio signals to sense objects within the local environment of the autonomous vehicle. In some embodiments, in addition to sensing objects, radar unit 214 may additionally sense the speed and/or heading of the objects. LIDAR unit 215 may sense objects in the environment in which the autonomous vehicle is located using lasers. LIDAR unit 215 could include one or more laser sources, a laser scanner, and one or more detectors, among other system components. Cameras 211 may include one or more devices to capture images of the environment surrounding the autonomous vehicle. Cameras 211 may be still cameras and/or video cameras. A camera may be mechanically movable, for example, by mounting the camera on a rotating and/or tilting a platform.

Sensor system 115 may further include other sensors, such as, a sonar sensor, an infrared sensor, a steering sensor, a throttle sensor, a braking sensor, and an audio sensor (e.g., microphone). An audio sensor may be configured to capture sound from the environment surrounding the autonomous vehicle. A steering sensor may be configured to sense the steering angle of a steering wheel, wheels of the vehicle, or a combination thereof. A throttle sensor and a braking sensor sense the throttle position and braking position of the vehicle, respectively. In some situations, a throttle sensor and a braking sensor may be integrated as an integrated throttle/braking sensor.

In one embodiment, vehicle control system 111 includes, but is not limited to, steering unit 201, throttle unit 202 (also referred to as an acceleration unit), and braking unit 203. Steering unit 201 is to adjust the direction or heading of the vehicle. Throttle unit 202 is to control the speed of the motor or engine that in turn controls the speed and acceleration of the vehicle. Braking unit 203 is to decelerate the vehicle by providing friction to slow the wheels or tires of the vehicle. Note that the components as shown in FIG. 2 may be implemented in hardware, software, or a combination thereof.

Referring back to FIG. 1, wireless communication system 112 is to allow communication between autonomous vehicle 101 and external systems, such as devices, sensors, other vehicles, etc. For example, wireless communication system 112 can wirelessly communicate with one or more devices directly or via a communication network, such as servers 103-104 over network 102. Wireless communication system 112 can use any cellular communication network or a wireless local area network (WLAN), e.g., using WiFi to communicate with another component or system. Wireless communication system 112 could communicate directly with a device (e.g., a mobile device of a passenger, a display device, a speaker within vehicle 101), for example, using an infrared link, Bluetooth, etc. User interface system 113 may be part of peripheral devices implemented within vehicle 101 including, for example, a keyboard, a touch screen display device, a microphone, and a speaker, etc.

Some or all of the functions of autonomous vehicle 101 may be controlled or managed by perception and planning system 110, especially when operating in an autonomous driving mode. Perception and planning system 110 includes the necessary hardware (e.g., processor(s), memory, storage) and software (e.g., operating system, planning and routing programs) to receive information from sensor system 115, control system 111, wireless communication system 112, and/or user interface system 113, process the received information, plan a route or path from a starting point to a destination point, and then drive vehicle 101 based on the planning and control information. Alternatively, perception and planning system 110 may be integrated with vehicle control system 111.

For example, a user as a passenger may specify a starting location and a destination of a trip, for example, via a user interface. Perception and planning system 110 obtains the trip related data. For example, perception and planning system 110 may obtain location and route information from an MPOI server, which may be a part of servers 103-104. The location server provides location services and the MPOI server provides map services and the POIs of certain locations. Alternatively, such location and MPOI information may be cached locally in a persistent storage device of perception and planning system 110.

While autonomous vehicle 101 is moving along the route, perception and planning system 110 may also obtain real-time traffic information from a traffic information system or server (TIS). Note that servers 103-104 may be operated by a third party entity. Alternatively, the functionalities of servers 103-104 may be integrated with perception and planning system 110. Based on the real-time traffic information, MPOI information, and location information, as well as real-time local environment data detected or sensed by sensor system 115 (e.g., obstacles, objects, nearby vehicles), perception and planning system 110 can plan an optimal route and drive vehicle 101, for example, via control system 111, according to the planned route to reach the specified destination safely and efficiently.

Server 103 may be a data analytics system to perform data analytics services for a variety of clients. In one embodiment, data analytics system 103 includes data collector 121 and machine learning engine 122. Data collector 121 collects driving statistics 123 from a variety of vehicles, either autonomous vehicles or regular vehicles driven by human drivers. Driving statistics 123 include information indicating the driving commands (e.g., throttle, brake, steering commands) issued and responses of the vehicles (e.g., speeds, accelerations, decelerations, directions) captured by sensors of the vehicles at different points in time. Driving statistics 123 may further include information describing the driving environments at different points in time, such as, for example, routes (including starting and destination locations), MPOIs, road conditions, weather conditions, etc.

Based on driving statistics 123, machine learning engine 122 generates or trains a set of rules, algorithms, and/or predictive models 124 for a variety of purposes. In one embodiment, algorithms 124 may include simulation algorithms that can be utilized during EMC simulation. Algorithms 124 can then be uploaded on ADVs to be utilized during autonomous driving in real-time.

Figure 3A:
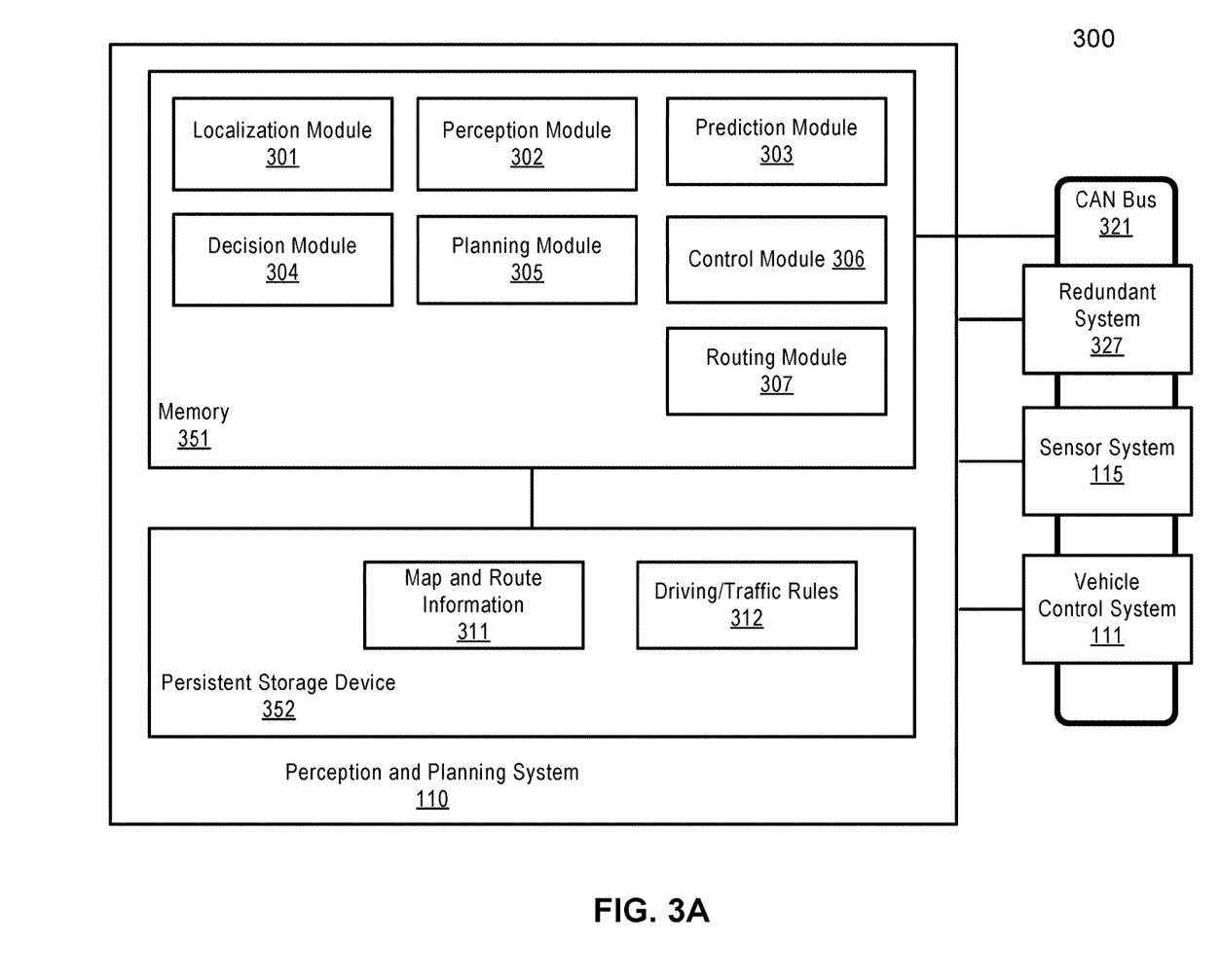
FIGS. 3A-3B are block diagrams illustrating an example of a perception and planning system used with an autonomous vehicle according to one embodiment.
Figure 3B:
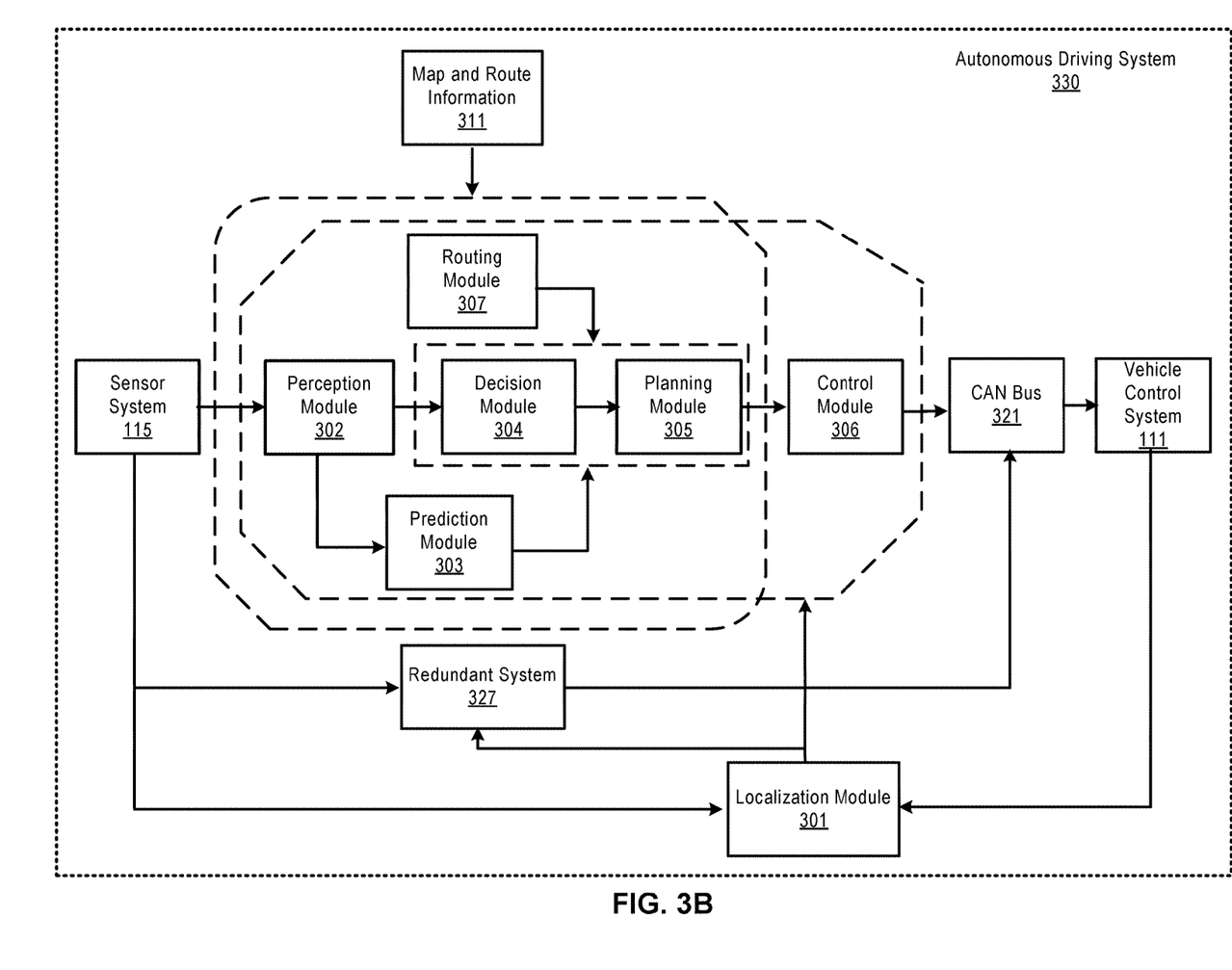

FIGS. 3A and 3B are block diagrams illustrating an example of a perception and planning system used with an autonomous vehicle according to one embodiment. System 300 may be implemented as a part of autonomous vehicle 101 of FIG. 1 including, but is not limited to, perception and planning system 110, control system 111, and sensor system 115. Referring to FIGS. 3A-3B, perception and planning system 110 includes, but is not limited to, localization module 301, perception module 302, prediction module 303, decision module 304, planning module 305, control module 306, and routing module 307.

Some or all of modules 301-307 may be implemented in software, hardware, or a combination thereof. For example, these modules may be installed in persistent storage device 352, loaded into memory 351, and executed by one or more processors (not shown). Note that some or all of these modules may be communicatively coupled to or integrated with some or all modules of vehicle control system 111 of FIG. 2. Some of modules 301-307 may be integrated together as an integrated module.

Localization module 301 determines a current location of autonomous vehicle 300 (e.g., leveraging GPS unit 212) and manages any data related to a trip or route of a user. Localization module 301 (also referred to as a map and route module) manages any data related to a trip or route of a user. A user may log in and specify a starting location and a destination of a trip, for example, via a user interface. Localization module 301 communicates with other components of autonomous vehicle 300, such as map and route information 311, to obtain the trip related data. For example, localization module 301 may obtain location and route information from a location server and a map and POI (MPOI) server. A location server provides location services and an MPOI server provides map services and the POIs of certain locations, which may be cached as part of map and route information 311. While autonomous vehicle 300 is moving along the route, localization module 301 may also obtain real-time traffic information from a traffic information system or server.

Based on the sensor data provided by sensor system 115 and localization information obtained by localization module 301, a perception of the surrounding environment is determined by perception module 302. The perception information may represent what an ordinary driver would perceive surrounding a vehicle in which the driver is driving. The perception can include the lane configuration, traffic light signals, a relative position of another vehicle, a pedestrian, a building, crosswalk, or other traffic related signs (e.g., stop signs, yield signs), etc., for example, in a form of an object. The lane configuration includes information describing a lane or lanes, such as, for example, a shape of the lane (e.g., straight or curvature), a width of the lane, how many lanes in a road, one-way or two-way lane, merging or splitting lanes, exiting lane, etc.

Perception module 302 may include a computer vision system or functionalities of a computer vision system to process and analyze images captured by one or more cameras in order to identify objects and/or features in the environment of autonomous vehicle. The objects can include traffic signals, road way boundaries, other vehicles, pedestrians, and/or obstacles, etc. The computer vision system may use an object recognition algorithm, video tracking, and other computer vision techniques. In some embodiments, the computer vision system can map an environment, track objects, and estimate the speed of objects, etc. Perception module 302 can also detect objects based on other sensors data provided by other sensors such as a radar and/or LIDAR.

For each of the objects, prediction module 303 predicts what the object will behave under the circumstances. The prediction is performed based on the perception data perceiving the driving environment at the point in time in view of a set of map/rout information 311 and traffic rules 312. For example, if the object is a vehicle at an opposing direction and the current driving environment includes an intersection, prediction module 303 will predict whether the vehicle will likely move straight forward or make a turn. If the perception data indicates that the intersection has no traffic light, prediction module 303 may predict that the vehicle may have to fully stop prior to enter the intersection. If the perception data indicates that the vehicle is currently at a left-turn only lane or a right-turn only lane, prediction module 303 may predict that the vehicle will more likely make a left turn or right turn respectively.

For each of the objects, decision module 304 makes a decision regarding how to handle the object. For example, for a particular object (e.g., another vehicle in a crossing route) as well as its metadata describing the object (e.g., a speed, direction, turning angle), decision module 304 decides how to encounter the object (e.g., overtake, yield, stop, pass). Decision module 304 may make such decisions according to a set of rules such as traffic rules or driving rules 312, which may be stored in persistent storage device 352.

Routing module 307 is configured to provide one or more routes or paths from a starting point to a destination point. For a given trip from a start location to a destination location, for example, received from a user, routing module 307 obtains route and map information 311 and determines all possible routes or paths from the starting location to reach the destination location. Routing module 307 may generate a reference line in a form of a topographic map for each of the routes it determines from the starting location to reach the destination location. A reference line refers to an ideal route or path without any interference from others such as other vehicles, obstacles, or traffic condition. That is, if there is no other vehicle, pedestrians, or obstacles on the road, an ADV should exactly or closely follows the reference line. The topographic maps are then provided to decision module 304 and/or planning module 305. Decision module 304 and/or planning module 305 examine all of the possible routes to select and modify one of the most optimal routes in view of other data provided by other modules such as traffic conditions from localization module 301, driving environment perceived by perception module 302, and traffic condition predicted by prediction module 303. The actual path or route for controlling the ADV may be close to or different from the reference line provided by routing module 307 dependent upon the specific driving environment at the point in time.

Based on a decision for each of the objects perceived, planning module 305 plans a path or route for the autonomous vehicle, as well as driving parameters (e.g., distance, speed, and/or turning angle), using a reference line provided by routing module 307 as a basis. That is, for a given object, decision module 304 decides what to do with the object, while planning module 305 determines how to do it. For example, for a given object, decision module 304 may decide to pass the object, while planning module 305 may determine whether to pass on the left side or right side of the object. Planning and control data is generated by planning module 305 including information describing how vehicle 300 would move in a next moving cycle (e.g., next route/path segment). For example, the planning and control data may instruct vehicle 300 to move 10 meters at a speed of 30 mile per hour (mph), then change to a right lane at the speed of 25 mph.

Based on the planning and control data, control module 306 controls and drives the autonomous vehicle, by sending proper commands or signals to vehicle control system 111 via a CAN bus 321, according to a route or path defined by the planning and control data. The planning and control data include sufficient information to drive the vehicle from a first point to a second point of a route or path using appropriate vehicle settings or driving parameters (e.g., throttle, braking, steering commands) at different points in time along the path or route.

In one embodiment, the planning phase is performed in a number of planning cycles, also referred to as driving cycles, such as, for example, in every time interval of 100 milliseconds (ms). For each of the planning cycles or driving cycles, one or more control commands will be issued based on the planning and control data. That is, for every 100 ms, planning module 305 plans a next route segment or path segment, for example, including a target position and the time required for the ADV to reach the target position. Alternatively, planning module 305 may further specify the specific speed, direction, and/or steering angle, etc. In one embodiment, planning module 305 plans a route segment or path segment for the next predetermined period of time such as 5 seconds. For each planning cycle, planning module 305 plans a target position for the current cycle (e.g., next 5 seconds) based on a target position planned in a previous cycle. Control module 306 then generates one or more control commands (e.g., throttle, brake, steering control commands) based on the planning and control data of the current cycle.

Note that decision module 304 and planning module 305 may be integrated as an integrated module. Decision module 304/planning module 305 may include a navigation system or functionalities of a navigation system to determine a driving path for the autonomous vehicle. For example, the navigation system may determine a series of speeds and directional headings to affect movement of the autonomous vehicle along a path that substantially avoids perceived obstacles while generally advancing the autonomous vehicle along a roadway-based path leading to an ultimate destination. The destination may be set according to user inputs via user interface system 113. The navigation system may update the driving path dynamically while the autonomous vehicle is in operation. The navigation system can incorporate data from a GPS system and one or more maps so as to determine the driving path for the autonomous vehicle.

As shown in FIGS. 3A-3B, a redundant system 327 can be provided to monitor the perception and planning system 110 to detect any abnormalities. In one embodiment, the redundant system 327 can run on a piece of separate hardware, for example, an industry standard electronic control unit (ECU). The redundant system 327 can communicate with the other AD modules via an internet hub, a local network, a message-based bus, or other means of communication. In the event that that the perception and planning system 110 encounters serious errors that cannot overcome by the perception and planning system 110, the control of the ADV would be passed to the redundant system 327. To that end, the redundant system 327 can include software modules that can perform the same functions as the perception and planning system 110. In one embodiment, the redundant system 327 can include a duplicate copy of the perception and planning system 110 as well as one or more software modules to monitor the performance of the perception and planning system 110.

Each module in the autonomous driving system (ADS) 330 in FIG. 3B can be implemented in software or hardware or a combination therefore. Note that according to one embodiment, an ADV may include a primary ADS and a redundant (or backup or secondary) ADS. Each of the primary ADS and redundant ADS may have some or all of the autonomous driving modules as shown in FIG. 3A. During the normal operations, the primary ADS is responsible for driving the vehicle, while the redundant ADS operates in a standby mode and configured to monitor operations of the primary ADS. In response to detecting that the primary ADS fails to function properly, the redundant ADS may take over the control of the vehicle, for example, to transition the vehicle to safer condition, e.g., decelerating and/or stopping the vehicle. In the example as shown in FIG. 3B, ADS 330 may represent a primary ADS except redundant system 327. Redundant system 327 may represent a redundant ADS. In this example, both the primary ADS and redundant ADS will share some sensors such as localization module 301. Each of the primary ADS and redundant ADS will perform the similar driving functions. However, the results of the redundant ADS may not be utilized to control the vehicle during the normal operations. The redundant ADS may monitor the operations of the primary ADS and compare the data against its own data to determine whether the primary ADS fails to operate properly.

EMC Simulator

Figure 4:
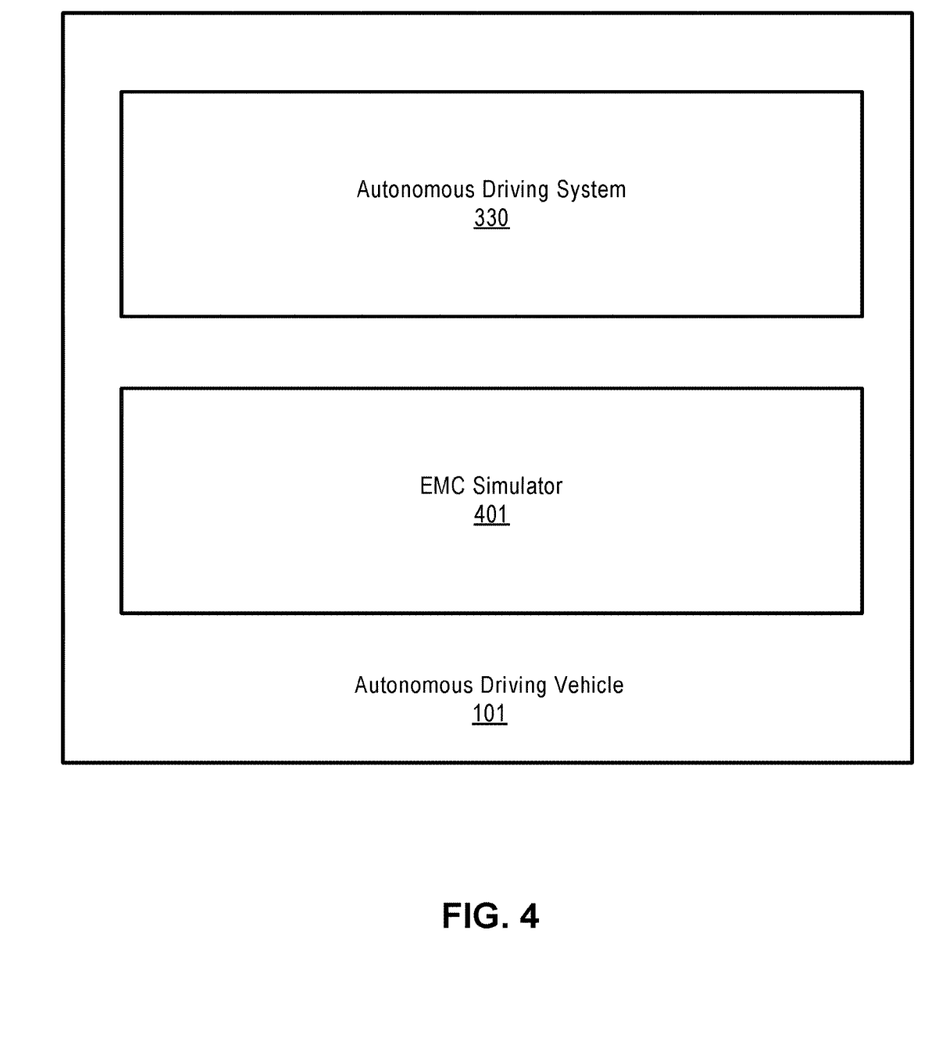
FIG. 4 is a block diagram illustrating an electromagnetic compatibility (EMC) simulator for performing EMC testing of an autonomous driving vehicle according to an embodiment.

FIG. 4 is a block diagram illustrating an electromagnetic compatibility (EMC) simulator for performing EMC testing of an autonomous driving vehicle according to an embodiment. As shown in FIG. 4, an EMC simulator 401 can be provided in the ADV 101. The EMC simulator EMC 401 can be used to perform EMC testing of the ADV 101 in an indoor EMC testing environment, where the ADV 101 is positioned at a fixed spot. EMC testing refers to testing of one or more autonomous driving functionalities of a particular driving scenario. The EMC environment is specifically set up for testing the performance of the associated autonomous driving modules (e.g., modules as shown in FIG. 3A) under the specific driving circumstances without requiring the vehicle to actually drive on the road.

In one embodiment, the EMC simulator 401 can include a duplicate of each module of the autonomous driving (AD) system 330, with one or more AD modules being modified to accommodate the various limitations resulted from the fixed location of the ADV 101 and the indoor EMC testing environment.

For example, when operating in an autonomous mode, the ADV 101 can rely on a high definition map, GPS signals, and an IMU unit for determining the positions of the ADV 101. However, since the ADV 101 is positioned at a fixed spot in an indoor EMC testing environment, the ADV 101 would not detect any GPS signals, or IMU signals. Further, no reference object on a high definition map can be used for estimating positions for the ADV 101 since such high definition map may not exist.

Accordingly, for the ADV 101 to simulate its driving in an outdoor environment, the AD modules in the EMC simulator 401 are modified to accommodate the various limitations associated with the indoor EMC testing environment.

Figure 5:
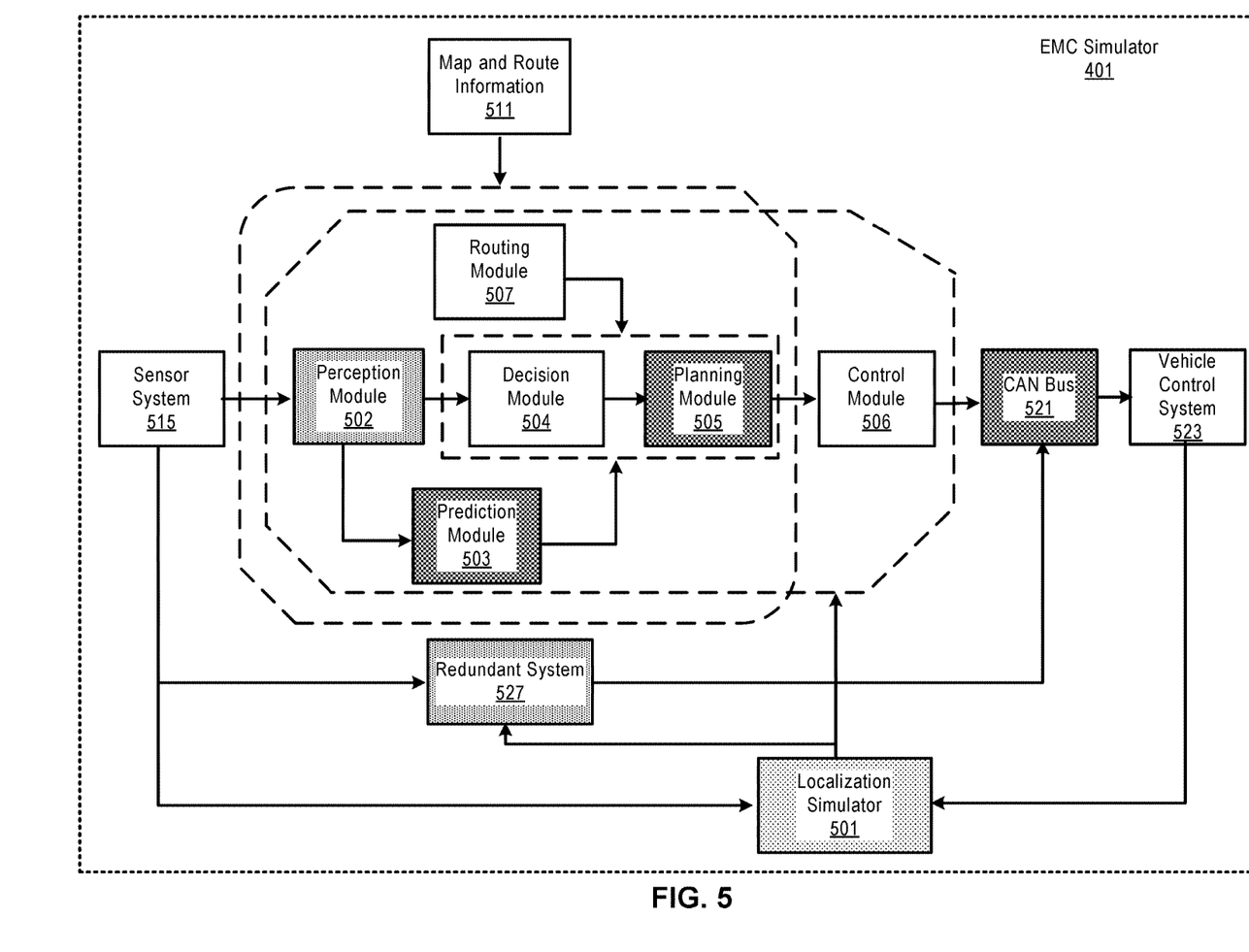
FIG. 5 is a block diagram illustrating an example of an EMC simulator according to one embodiment.

FIG. 5 is a block diagram illustrating an example of an EMC simulator according to one embodiment. As shown in FIG. 5, the EMC simulator 401 is a software-level simulator, and represents a modified version of the AD system 330. As shown in FIG. 5, each of the AD modules 501-527 has a corresponding AD module in the autonomous driving system 330.

In one embodiment, a number of AD modules in the EMC simulator 401 can be modified. Examples of the modified AD modules include the perception module 502, the planning module 505, the CAN bus module 521, the prediction module 503, and the redundant system 527. In addition, the localization simulator 501 can replace the localization module 301 in the autonomous driving system 330.

More specifically, in one embodiment, the localization simulator can accommodate the fixed location of the ADV 101 and the lack of some sensor data. In an indoor EMC testing environment, GPS signals and useful point cloud information may not be available due to the blocking of walls and buildings. Further, correct IMU and vehicle feedbacks are also unavailable. Without the sensor data, the localization module 301 would not work as desired.

In one embodiment, the localization simulator 501 can include all the functions of the localization module 301 with some modifications, such that the localization simulator 501 can estimate the positions of the ADV 101 in each driving cycle based on an initial given position, an initial given heading, and a set of driving commands for the ADV 101.

In one embodiment, the position and heading of the ADV 101 can be given or configured during the first driving cycle. The position and heading of the ADV 101 in each following driving cycle can then be calculated based on a position and heading of the ADV 101 in a previous driving cycle and a set of given driving commands. The localization simulator 501 thus can perform its localization function without the type of sensor data it would have in an outdoor driving environment.

In one embodiment, the perception module 502 can be modified such that the module needs to be tested only with short-distance objects, for example, those objects in the indoor environment; or objects on either side of the ADV 101. With the modified perception module 502, the ADV 101 would calculate the relative speed between the ADV 101 and an object differently. Since the speed of the ADV 101 is always zero, the perception module 502 would take the speed of the object as the relative speed. The modified perception module 502 can trim EMC testing devices or one or more other known static objects in the EMC testing environment. By trimming the devices and objects, the perception module 502 would dismiss them as obstacles to prevent the ADV 101 from confusing them with real obstacles.

In one embodiment, the prediction module 503 can be modified to use free moves of a moving object to predict its next move. Before being modified, the prediction module 503 can use information on a high definition map to predict the next move of an object.

For example, the ADV 101 can predict the next move of a pedestrian based on map information—if the map shows a wall in front of the pedestrian, the pedestrian has to stop before the wall and change his walking direction.

However, a map may not have the information for the indoor environment. Therefore, the ADV needs to rely on the free moves the pedestrian to predict his next move. For example, if the pedestrian walks towards the east in one driving cycle of the ADV 101, the ADV 101 can predict that he would continue walking toward the east in the next driving cycle without information from the pedestrian indicating otherwise.

In one embodiment, the planning module 505 may be modified to disable or remove the feedback mechanism. Before being modified, the planning module 505, while performing the route planning function, can compare the difference between an actual position and a planned/estimated position of the ADV 101. If the difference between the actual position and the planned position exceeds a threshold, the ADV 101 may adjust the driving commands to reduce the difference. The planning module 505 can rely on a feedback mechanism to determine such a difference. However, in the indoor environment, the actual position of the ADV 101 is always the same while the planned position constantly changes from driving cycle to driving cycle, the difference between the actual position and the planned position would be almost always different. Therefore, the feedback mechanism will not serve a useful purpose.

In one embodiment, the redundant system 527 may be modified to redefine items to be monitored. Otherwise, the redundant system 527 would constantly send out warnings and alerts. Thus, the redundant system 527 is aware of the EMC testing situation such that certain alerts may not be sent.

For example, the redundant system 527 can be modified to stop checking GPS signals, or the speed of the ADV. GPS signals can be blocked by the walls and therefore the redundant system 527 would constantly generate warning messages for the missing of GPS signals. The objects and pedestrians in the indoor EMC testing environment have limited spaces to move around, while the ADV 101 is to simulate its driving in an outdoor environment. Without being modified, the redundant system 527 would determine that the ADV 101 is to hit the objects and the pedestrians, and therefore would constantly send out warning messages.

In one embodiment, in the indoor EMC testing environment, the ADV 101 would be positioned at a fixed spot such that the car wheels can only move forward and backward, but cannot make turns. This set up is for the convenience of the EMC testing. The CAN bus module 521, however, needs to be modified to allow only longitudinal control signals.

Further, unlike the original CAN bus module 321, the modified CAN bus module 521 does not send feedback messages from the vehicle control system 523 to other AD modules. Typically, the CAN bus module 321 sends a command to the vehicle control system 523 for execution. The vehicle control system 523 sends a feedback message after executing the command to the CAN bus module 527, which would forward the feedback message to an AD module that generates the command. When AD modules fail to receive feedback messages from the vehicle control system 523, the ADV 101 would operate in an open loop autonomous driving mode.

In one embodiment, the vehicle control system 523 can be modified to fake GPS time synchronization signals since such signals do not exist.

Figure 6:
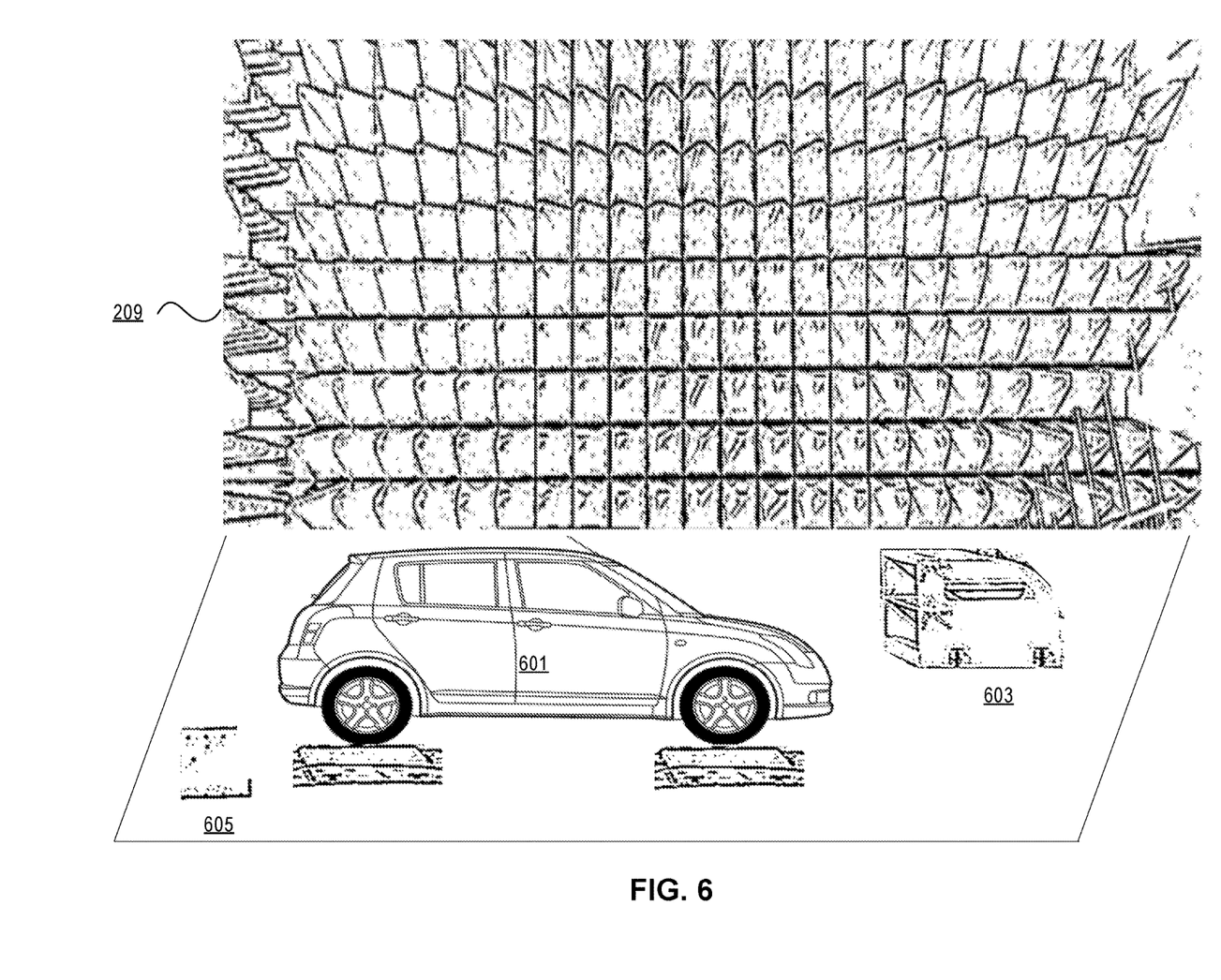
FIG. 6 illustrates an example of an indoor EMC testing environment according to one embodiment.

FIG. 6 illustrates an example of an indoor EMC testing environment according to one embodiment. As shown in FIG. 6, the EMC testing environment includes a number of EMC testing devices 603 and 605, and a wall 209 that can emit strong electromagnetic interference (EMI). An autonomous driving vehicle 601 can be positioned on a rack such that the wheels of the ADV 601 can move forward and backward, but cannot make turns.

In one embodiment, the EMC simulator 401 described in FIG. 5 can be installed in the vehicle 601 to test the performance of the AD modules under the influences of the electromagnetic interference. The devices 603 and 605 would be trimmed by the ADV 601 from its perception module such that the ADV 601 would dismiss them as obstacles in performing its perception function. In one embodiment, dummy figures can be used as pedestrians in the EMC testing.

Figure 7:
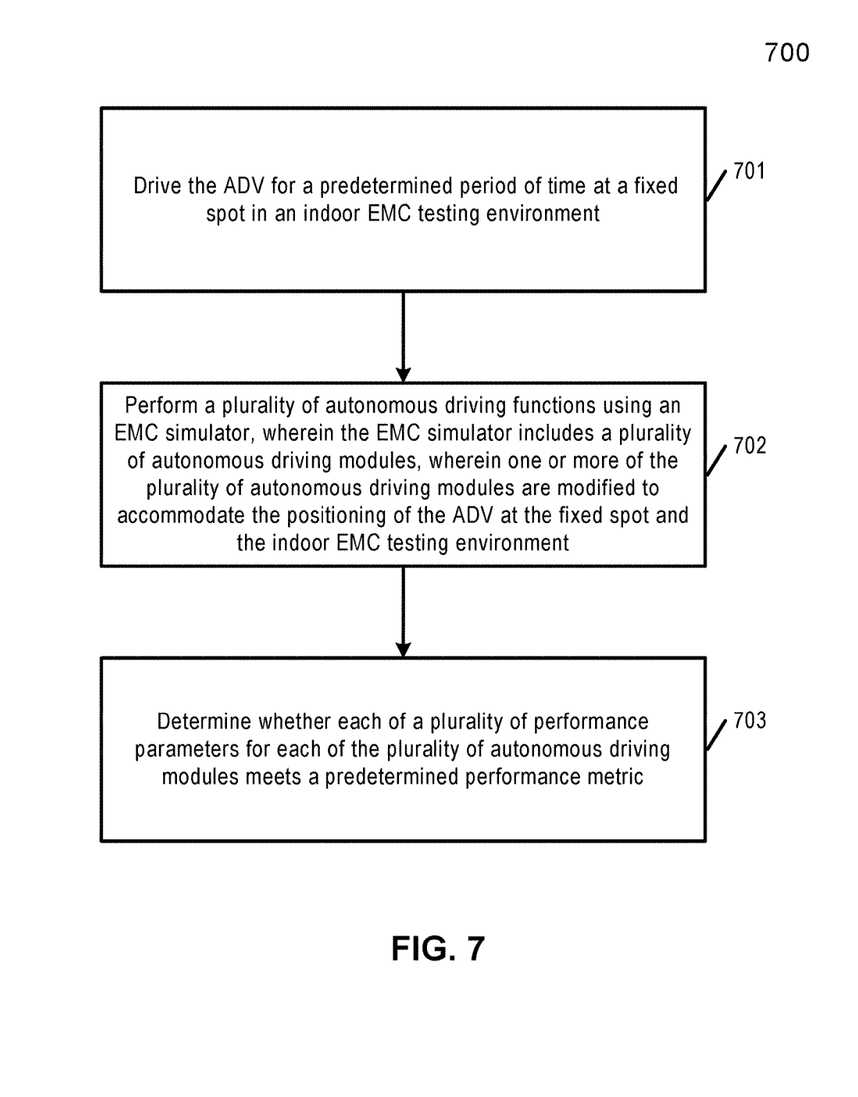
FIG. 7 is a block diagram illustrating an example of a process of performing EMC testing of an autonomous driving vehicle according to an embodiment.

FIG. 7 is a block diagram illustrating an example of a process of performing EMC testing of an autonomous driving vehicle according to an embodiment. Process 700 may be performed by processing logic which may include software, hardware, or a combination thereof. For example, process 700 may be performed by the EMC simulator 401 in FIG. 4.

Referring to FIG. 7, in operation 701, the processing logic drives an autonomous driving vehicle for a predetermined period of time (e.g., 2 hours) at a fixed spot in an indoor EMC testing environment. In operation 702, the processing logic performs a plurality of autonomous driving functions using an EMC simulator that includes a plurality of autonomous driving modules, wherein one or more of the plurality of autonomous driving modules are modified to accommodate the positioning of the ADV at the fixed spot and the indoor EMC testing environment. In operation 703, the processing logic determines whether each of a plurality of performance parameters for each of the plurality of driving modules meets a predetermined performance metric. The performance metric for each performance parameter for an autonomous driving module can be defined by the EMC tester.

Note that some or all of the components as shown and described above may be implemented in software, hardware, or a combination thereof. For example, such components can be implemented as software installed and stored in a persistent storage device, which can be loaded and executed in a memory by a processor (not shown) to carry out the processes or operations described throughout this application. Alternatively, such components can be implemented as executable code programmed or embedded into dedicated hardware such as an integrated circuit (e.g., an application specific IC or ASIC), a digital signal processor (DSP), or a field programmable gate array (FPGA), which can be accessed via a corresponding driver and/or operating system from an application. Furthermore, such components can be implemented as specific hardware logic in a processor or processor core as part of an instruction set accessible by a software component via one or more specific instructions.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the disclosure also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments of the present disclosure are not described with reference to any particular programming language. It will be appreciated that a variety of programming languages may be used to implement the teachings of embodiments of the disclosure as described herein.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. A computer-implemented method of performing electromagnetic compatibility (EMC) testing of an autonomous driving vehicle (ADV), the method comprising:
   driving the ADV for a predetermined period of time at a fixed spot in an indoor EMC testing environment representing a particular driving scenario;
   performing a plurality of autonomous driving functions using an EMC simulator, wherein the EMC simulator includes a plurality of autonomous driving modules, wherein one or more of the plurality of autonomous driving modules are modified to accommodate the positioning of the ADV at the fixed spot and the indoor EMC testing environment, while carrying out one or more autonomous driving functions that will be performed during real-time driving; and
   determining whether each of a plurality of performance parameters for each of the plurality of autonomous driving modules meets a predetermined performance metric.

2. The method of claim 1, wherein a plurality of limitations is associated with the indoor EMC testing environment, and include the ADV being positioned at a fixed location, wheels of the ADV being prevented from making turns, lack of one or more types of sensor data, and lack of corresponding map information for the indoor EMC testing environment.

3. The method of claim 1, wherein the one or more modified autonomous driving modules include one or more of a localization module, a perception module, a planning module, a prediction module, a redundant module, or a controller area network (CANbus) module.

4. The method of claim 3, wherein the localization module is modified such that the localization module determines a position of the ADV in each of a plurality of driving cycles based on a given initial position, a given initial heading, and a plurality of driving commands.

5. The method of claim 3, wherein the perception module is modified such that one or more of the following changes are to occur:
   that the perception module is to be tested with only objects within a predetermined distance;
   that calculation of a relative speed between the ADV and an object within the predetermined distance is compensated for the fixed location of the ADV; or
   that only the perception module is to be tested with objects on either side of the ADV.

6. The method of claim 3, wherein the planning module is modified such that feedback to the planning module is disabled.

7. The method of claim 3, wherein the prediction module is modified such that only free moves are used to predict a next move of a moving object.

8. The method of claim 3, wherein the redundant module is modified such that the redundant module stops checking one or more items.

9. The method of claim 3, wherein the CAN bus function is modified such that only longitudinal wheel controls are allowed.

10. A non-transitory machine-readable medium having instructions stored therein for performing electromagnetic compatibility (EMC) testing of an autonomous driving vehicle (ADV), which instructions when executed by a processor, cause the processor to perform operations, the operations comprising:
    driving the ADV for a predetermined period of time at a fixed spot in an indoor EMC testing environment representing a particular driving scenario;
    performing a plurality of autonomous driving functions using an EMC simulator, wherein the EMC simulator includes a plurality of autonomous driving modules, wherein one or more of the plurality of autonomous driving modules are modified to accommodate the positioning of the ADV at the fixed spot and the indoor EMC testing environment, while carrying out one or more autonomous driving functions that will be performed during real-time driving; and
    determining whether each of a plurality of performance parameters for each of the plurality of autonomous driving modules exceeds a performance metric.

11. The non-transitory machine-readable medium of claim 10, wherein a plurality of limitations is associated with the indoor EMC testing environment, and include the ADV being positioned at a fixed location, wheels of the ADV being prevented from making turns, lack of one or more types of sensor data, and lack of corresponding map information for the indoor EMC testing environment.

12. The non-transitory machine-readable medium of claim 10, wherein the one or more modified autonomous driving modules include one or more of a localization module, a perception module, a planning module, a prediction module, a redundant module, or a controller area network (CANbus) module.

13. The non-transitory machine-readable medium of claim 12, wherein the localization module is modified such that the localization module determines a position of the ADV in each of a plurality of driving cycles based on a given initial position, a given initial heading, and a plurality of driving commands.

14. The non-transitory machine-readable medium of claim 12, wherein the perception module is modified such that one or more of the following changes are to occur:
that the perception module is to be tested with only objects within a predetermined distance;
that calculation of a relative speed between the ADV and an object within the predetermined distance is compensated for the fixed location of the ADV; or
that only the perception module is to be tested with objects on either side of the ADV.

15. The non-transitory machine-readable medium of claim 12, wherein the planning module is modified such that feedback to the planning module is disabled.

16. The non-transitory machine-readable medium of claim 12, wherein the prediction module is modified such that only free moves are used to predict a next move of a moving object.

17. The non-transitory machine-readable medium of claim 12, wherein the redundant module is modified such that the redundant module stops checking one or more items.

18. The non-transitory machine-readable medium of claim 12, wherein the CAN bus module is modified such that only longitudinal wheel controls are allowed.

19. A data processing system, comprising:
a processor; and
a memory coupled to the processor to store instructions therein for performing electromagnetic compatibility (EMC) testing of an autonomous driving vehicle (ADV), which instructions when executed by the processor, cause the data processing system to perform operations, the operations including
driving the ADV for a predetermined period of time at a fixed spot in an indoor EMC testing environment representing a particular driving scenario;
performing a plurality of autonomous driving functions using an EMC simulator, wherein the EMC simulator includes a plurality of autonomous driving modules, wherein one or more of the plurality of autonomous driving modules are modified to accommodate the positioning of the ADV at the fixed spot and the indoor EMC testing environment, while carrying out one or more autonomous driving functions that will be performed during real-time driving; and
determining whether each of a plurality of performance parameters for each of the plurality of autonomous driving modules exceeds a predetermined performance metric.

20. The system of claim 19, wherein a plurality of limitations is associated with the indoor EMC testing environment, and include the ADV being positioned at a fixed location, wheels of the ADV being prevented from making turns, lack of one or more types of sensor data, and lack of corresponding map information for the indoor EMC testing environment.

* * * * *